United States Patent
Liu

(10) Patent No.: US 7,259,405 B2
(45) Date of Patent: Aug. 21, 2007

(54) ORGANIC PHOTOELECTRIC DEVICE WITH IMPROVED ELECTRON TRANSPORT EFFICIENCY

(75) Inventor: Tswen-Hsin Liu, Jhudong Township, Hsinchu County (TW)

(73) Assignee: AU Optronics Corporation, Hsinchu (TW)

( * ) Notice: Subject to any disclaimer, the term of this patent is extended or adjusted under 35 U.S.C. 154(b) by 45 days.

(21) Appl. No.: 10/995,878

(22) Filed: Nov. 23, 2004

(65) Prior Publication Data

US 2006/0108578 A1 May 25, 2006

(51) Int. Cl.
*H01L 29/08* (2006.01)
(52) U.S. Cl. .................. 257/103; 257/40; 257/E51.01; 438/99
(58) Field of Classification Search ............. 257/40, 257/103, E51.012, E51.013, E51.014, E51.015, 257/E51.016, E51.017, E51.018, E51.019, 257/E51.02, E51.021, E51.022; 438/82, 438/99
See application file for complete search history.

(56) References Cited

U.S. PATENT DOCUMENTS

| | | | |
|---|---|---|---|
| 5,118,986 A * | 6/1992 | Ohnuma et al. | 313/504 |
| 5,739,635 A * | 4/1998 | Wakimoto | 313/504 |
| 6,281,627 B1 * | 8/2001 | Arai et al. | 313/506 |
| 2002/0005696 A1 * | 1/2002 | Yamazaki et al. | 315/169.3 |
| 2002/0155319 A1 * | 10/2002 | Kawamura et al. | 428/690 |
| 2003/0089252 A1 * | 5/2003 | Sarnecki | 101/170 |
| 2003/0170493 A1 * | 9/2003 | Chen et al. | 428/690 |
| 2003/0234609 A1 * | 12/2003 | Aziz et al. | 313/504 |
| 2004/0219389 A1 * | 11/2004 | Lee et al. | 428/690 |
| 2005/0035430 A1 * | 2/2005 | Beigel | 257/532 |
| 2005/0116240 A1 * | 6/2005 | Kim et al. | 257/88 |

OTHER PUBLICATIONS

Shinar, Joseph, ED. Organic Light-Emitting Devices: A Survey. AIP Press. New York. 2004. pp. 19-20.*

* cited by examiner

*Primary Examiner*—B. William Baumeister
*Assistant Examiner*—Matthew W. Such
(74) *Attorney, Agent, or Firm*—Ware, Fressola, Van Der Sluys & Adolphson LLP

(57) ABSTRACT

An opto-electronic device, such as an OLED or organic solar cell, having an electrode structure for use as a cathode. The electrode structure includes an electrically conductive layer and an inorganic layer, wherein the inorganic layer is made of at least one oxide-based alkali or alkaline earth metal intercalation compound. The intercalation compound having the chemical formula of $A_x(M_yO_z)$, where x, y, z are positive integers greater than zero, A is an alkali metal or alkaline earth element, M is a metal, transitional metal or metallic alloy, and O is oxygen. Furthermore, a buffer layer made of alkali oxides or halides, or alkaline earth oxides or halides can be provided between the conductive layer and the inorganic layer.

18 Claims, 9 Drawing Sheets

ORGANIC PHOTOELECTRIC DEVICE WITH IMPROVED ELECTRON TRANSPORT EFFICIENCY

FIELD OF THE INVENTION

The present invention relates generally to photoelectric devices and, more specifically, to organic light-emitting diodes and organic photocells.

BACKGROUND OF THE INVENTION

Organic light-emitting diodes (OLEDs) and organic photocells are structurally similar in that they all have an optoelectronic sub-structure disposed between two electrodes. The optoelectronic sub-structure is capable of converting electrical charge to light or converting photon energy to electrical charge. Typically at least one of the electrodes is made of a transparent material such as Indium Tin Oxide (ITO) so as to allow light to reach the optoelectronic sub-structure for photon to electric charge conversion or to allow light produced in the optoelectronic sub-structure to transmit therefrom.

OLEDs are known in the art. For example, Hung et al. (U.S. Pat. No. 5,776,623) also discloses an electroluminescent device wherein a 15 nm-thick CuPc layer is used as an hole injection layer (HIL), a 60 nm-thick NPB layer is used as a hole transporting layer (HTL), a 75 nm-thick $Alq_3$ layer is used as an electron transport layer (ETL). A 0.5 nm-thick lithium fluoride layer is also deposited on the $Alq_3$ layer. The lithium fluoride layer can be replaced by a magnesium fluoride, a calcium fluoride, a lithium oxide or a magnesium oxide layer.

Kido et al. (U.S. Pat. No. 6,013,384) discloses, as shown in FIG. 1a, an organic electroluminescent device 10 wherein the optoelectronic sub-structure consists of a hole transport layer (HTL) 13, a luminescent layer 14 and a metal-doped organic compound layer 15 disposed between an anode layer 12 and a cathode layer 16. The device is fabricated on a substrate 11. According to Kido et al., the organic compounds which can be used in the formation of the luminescent layer, the electron transport layer and the metal-doped layer in the OLED device, include polycyclic compounds, condensed polycyclic hydrocarbon compounds, condensed heterocyclic compounds, etc. The dopant in the metal-doped organic compound layer is a metal having a work function of less than or equal to 4.2 eV. The luminescent layer can be made of $Alq_3$ (an aluminum complex of tris(8-quinolinolato)), for example. The hole transport layer 13 can be made of an arylamine compound. The anode layer 12 is made of ITO and the cathode 16 is an aluminum layer.

Weaver et al. (U.S. Publication No. 2004/0032206 A1) discloses another OLED including an alkali metal compound layer. As shown in FIG. 1b, the OLED 20 is fabricated on a plastic substrate 21 pre-coated with an ITO anode 22. The cathode consists of two layers: a metal oxide layer 28 deposited over a layer 27 of Mg or Mg alloy. The alkali metal compound layer 26 can be made of alkali halides or alkali oxides such as LiF and $Li_2O$. The organic layers include an HTL layer 23, an emissive layer (EML) 24 and an electron transport layer (ETL) 25. In particular, a layer of copper-phthalocyanine (CuPc) is deposited to a thickness of about 10 nm thick over the ITO anode to improve hole injection and device lifetime. A hole transport layer of 4,4'-[N-(1-naphthyl)-N-phenyl-amino]biphenyl (NPD) is deposited to a thickness of about 30 nm over the CuPc. An emissive layer of 4,4'-N,N'-dicarbazole-biphenyl (CBP) doped with fac-tris(2-phenylpyridine-)-iridium $(Ir(ppy)_3)$ is deposited to a thickness of 30 nm over the NPD. A hole blocking layer of aluminum(III)bis(2-methyl-8-quinolinato) 4-phenylphenolate (BAlq) is deposited to a thickness of about 10 nm over the emissive layer. An electron transport layer of 8-tris-hydroxyquinoline aluminum $(Alq_3)$ was deposited to a thickness of about 40 µm over the BAlq. A layer of LiF about 0.5-1 nm thick is deposited after the Alq3 and before the Mg alloy (including Mg:Ag).

Raychaudhuri et al. (U.S. Pat. No. 6,551,725 B2) discloses an OLED 30 wherein a buffer structure is disposed between the organic layer and the cathode. As shown in FIG. 1c, the buffer structure consists of two layers, a first layer 37 containing an alkali halide is provided over the electron transfer layer (ETL) 36, and a second buffer layer 38 containing a metal or metal alloy having a work function between 2.0 and 4.0 eV is provided over the first buffer layer 37. In addition, a hole injection layer (HIL) 33 is provided between the anode 32 and the organic layers. The hole injection layer can be made of a porphorinic or phthalocyanine compound. The hole injection layer can also be made of a fluorinated polymer $CF_x$, where x is 1 or 2. The hole transport layer (HTL) 34 can be made of various classes of aromatic amines. The emissive layer (EML) 35 provides the function of light emission produced as a result of recombination of holes and electrons in the layer. The emissive layer is comprised of a host material doped with one or more fluorescent dyes. According to Raychaudhuri et al., the preferred host materials include the class of 8-quinolinol metal chelate compounds with the chelating metals being Al, Mg, Li and Zn. The cathode layer 39 is made by sputter deposition to provide increased conductivity and reflectivity of the electron injection layer of the device.

Photovoltaic devices such as photocells and solar cells are also known in the art. A typical organic solar cell is shown in FIG. 2. As shown in FIG. 2, solar cell 40 consists of a base electrode (ITO) 42 provided on a substrate 41, a buffer layer 43, a ZnPc (zinc-phthalocyanine) layer 44, a fullerene $(C_{60})$ layer 45, a top buffer layer 46 and a top electrode 47. The base layer can be made of 3,4-polyethylenedioxythiophene: polystyrenesuffonate (PEDOT:PSS), for example. The top buffer layer can be made of 2,9-dimethyl-4,7-diphenyl-1, 10-phenanthroline (also called bathocuproine or BCP). Together, the ZnPc layer and the fullerene layer make an organic active layer for the solar cell. Thus, a photocell such as an organic solar cell, like an OLED, comprises a top electrode, an organic optoelectronic sub-structure and a base electrode. The basic principle of an organic solar cell can be found in Forrest et al. U.S. Pat. No. 6,580,027 B2). The commonalities between an OLED and an organic solar cell can be found in Meissner et al. (U.S. Pat. No. 6,559,375 B1).

OLEDs and organic solar cells are organic optoelectronic diodes. Such an optoelectric diode comprises a first electrode and a second electrode separated by one or more active organic optoelectronic layers. In an OLED, electrons and holes are injected from the electrodes through corresponding transport layers into a luminescent layer. The combination of the electrons and holes produces excitons. These excitons produce light in a relaxation process. In an organic solar cell, ambient light produces excitons at the interfaces between the active layer and the adjacent layers. Through a dissociation process, the excitons produce electrons and holes. Through a p-type or an n-type transport layer, the electrons and holes are separately transported to the electrodes, thereby producing electrical currents.

In general, intrinsic carriers do not exist in the organic layers within an OLED or an organic solar cell. In order to reduce the driving voltage in an OLED or to increase the electrical current in an organic solar cell, it is possible to insert a layer of alkali halide or alkali oxide, such as LiF, CsF, Li$_2$O and MgF, between the organic electron transport layer and the metallic cathode (see Hung et al.). The insertion of an alkali halide layer can effectively lower the electron injection energy barrier and thus increase the injection of electrons. However, because alkali halides are good insulation materials, the inserted layer must be sufficiently thin in order to produce a tunneling effect. Alternatively, n-type dopants, such as Cs, Li and Mg that have strong electron-donating characteristics can be incorporated into the organic election transport layer by way of co-deposition (see Kido et al.) As such, the Fermi energy level of the organic electron transport layer can be brought closer to the lowest unoccupied molecular orbital (LUMO) energy level (see Forrest et al. regarding LUMO in a photocell structure). However, because these types of dopant metals are chemically active, they may not be suitable for use in the thermal evaporation process that is commonly used in OLED manufacturing.

It is thus advantageous and desirable to provide a method and a device structure to increase the operations efficiency in an optoelectronic device such as an organic light emitting diode or an organic photocell.

SUMMARY OF THE INVENTION

The present invention uses at least one layer of oxide-based alkali or alkaline-earth metal intercalation compound as a carrier transport layer in an organic optoelectronic device. In particular, the inserted layer is disposed between an electron injection layer or cathode and the organic sub-structure of the organic optoelectronic device in order to increase the transportability of electrons toward the organic sub-structure. Oxide-based alkali or alkaline-earth metal intercalation compounds are non-toxic and chemically stable. Furthermore, they can be deposited onto the optoelectronic device by the thermal evaporation process.

Thus, the first aspect of the present invention provides an optoelectronic device, comprising:
 a first electrode;
 a second electrode disposed in relationship to the first electrode;
 an organic optoelectronic sub-structure disposed between the first and the second electrodes; and
 an inorganic layer substantially made of at least one oxide-based alkali or alkaline-earth metal intercalation compound in association to the organic optoelectronic sub-structure.

According to the present invention, the oxide-based alkali or alkaline-earth metal intercalation compound is selected from the group consisting of a plurality of metal-oxides characterized by the chemical formula of $A_x(M_yO_z)$, wherein
 x, y, z are positive integers greater than zero;
 A is an element selected from the group consisting of alkali and alkaline-earth element;
 M is an element selected from the group consisting of metals, transitional metals and metallic alloys; and
 O is an oxygen atom.

According to the present invention the oxide-based alkali or alkaline-earth metal intercalation compound is characterized by the chemical formula of $A_x(M_yO_z)$, wherein
 x, y, z are positive integers greater than zero;
 A is an element selected from Group 1 and Group 2 in the Periodic Table of Elements;
 M is an element selected from Group 3 through Group 15 in the Period Table of Elements; and
 O is an oxygen atom.

According to the present invention, the oxide-based alkali or alkaline-earth metal intercalation compound is selected from the group consisting of LiMn$_2$O$_4$, LiCoO$_2$, LiNbO$_3$, Li$_2$WO$_4$, Cs$_2$WO$_4$, CsMnO$_4$, CsVO$_4$, CsTi$_6$O$_{13}$, MgTiO$_3$, MgWO$_4$, MgZrO$_3$, Li(Ni$_{0.8}$Co$_{0.2}$)O$_2$.

According to the present invention, the first electrode comprises an anode;
 the second electrode comprises a cathode; and
 the inorganic layer is disposed between the cathode and the organic optoelectronic sub-structure, and wherein the sub-structure comprises:
 a hole transport layer adjacent to the anode,
 an electron transport section adjacent to the inorganic layer; and
 an emissive section between the hole transport layer and the electronic transport section.

According to the present invention, the device further comprises: a hole injection layer disposed between the anode and the hole transport layer.

According to the present invention, the anode is made from one or more materials selected from the group consisting of indium-tin oxide, aluminum doped zinc oxide, indium doped zinc oxide, tin oxide, magnesium-indium oxide, nickel-tungsten oxide, and cadmium-tin oxide.

According to the present invention, the cathode is made from one or more of the materials selected from the group consisting of aluminum, silver, and magnesium-silver alloy.

According to the present invention, the emissive section and the electron transport section are made substantially of Alq$_3$; the hole transport layer is made substantially of NPB; the hole injection layer is made substantially of CuPc.

According to the present invention, the device further comprises an insulation layer, having a thickness between 0.3 and 5 nm, disposed between the cathode and the inorganic layer, wherein the insulation layer is made substantially of alkali halide or alkali oxide, such as LiF. The device comprises a light emitting device.

Alternatively, the device comprises a photocell and the organic optoelectronic layer comprises:
 a hole transport layer adjacent to the first electrode;
 an electron transport layer adjacent to the inorganic layer; and
 an active layer disposed between the hole transport layer and the electron transport layer for producing electron-hole pairs in response to electromagnetic radiation.

The second aspect of the present invention provides an electrode structure for use in an optoelectronic device, the optoelectronic device comprising an organic optoelectronic sub-structure having an electron flow associated thereto. The electrode structure comprises:
 an electrically conducting layer for providing an electric current associated with the electron flow; and
 an inorganic layer for enhancing said electron flow, wherein the inorganic layer is made of at least one of the materials characterized by the chemical formula of Ax(MyOz), wherein
 x, y, z are positive integers greater than zero;
 A is selected from the group consisting of alkali and alkaline-earth elements;
 M is selected from the group consisting of metals, transitional metals and alloys; and
 O is an oxygen atom.

According to the present invention, the electrode structure further comprises an insulation layer, having a thickness between 0.3 to 5 nm, disposed between the inorganic layer and electrically conducting layer, and the insulation layer is made substantially of alkali halide or alkali oxide.

The third aspect of the present invention provides a method to improve operational efficiency of an optoelectronic device, the optoelectronic device comprising a first electrode, a second electrode and an organic optoelectronic sub-structure disposed between the first and the second electrodes, wherein the efficiency of the optoelectronic device is at least partially based on an electron transport process in the optoelectronic sub-structure. The method comprises the step of providing adjacent to the organic optoelectronic sub-structure an inorganic layer made substantially of a metal oxide doped with at least one electron-donating dopant, thereby enhancing the electron transport process, wherein the dopant is selected from the group consisting of alkali metals and alkaline-earth metals.

According to the present invention, the doped metal oxide is selected from the group of compounds characterized by the chemical formula of $A_x(M_yO_z)$, wherein x, y, z are positive integers greater than zero;

A is an alkali or alkaline-earth element;

M is selected from the group consisting of metals, transitional metals and alloys; and O is an oxygen atom.

According to the present invention, the optoelectronic device comprises a light emitting device and the optoelectronic sub-structure comprises an emissive section, an electron transport section for providing electrons and a hole transport section for providing holes so that at least some of the provided electrons and holes combine in the emissive section to produce electromagnetic radiation; the first electrode comprises an anode adjacent to the hole transport section, the second electrode comprises a cathode adjacent to the election transport section, and the inorganic layer of metal oxide is disposed between the electron transport section and the cathode for carrying out said enhancing.

According to the present invention, the optoelectronic device comprises a photocell and the optoelectronic sub-structure comprises an active layer for producing electron-hole pairs in response to electromagnetic radiation, an electron transport section for transporting at least some of electrons produced by said electron-hole pairs to the first electrode, and a hole transport section for transporting at least some of holes produced by the electron-hole pairs to the second electrode.

The present invention will become apparent upon reading the description taken in conjunction with FIGS. 3a-6.

DETAILED DESCRIPTION OF THE INVENTION

Figure 1B:
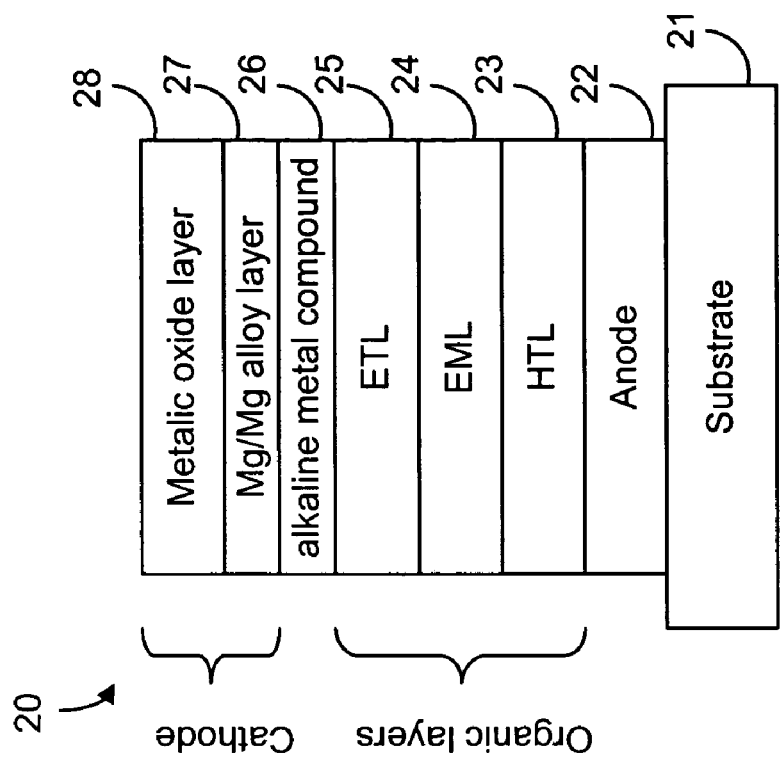
FIG. 1b is a schematic representation showing another prior art organic light emitting diode.
Figure 1A:
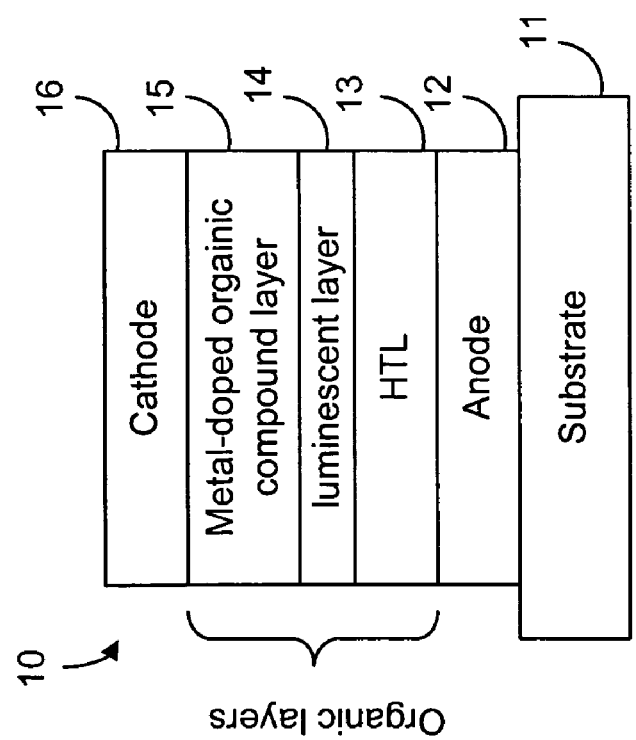
FIG. 1a is a schematic representation showing a prior art organic light emitting diode.
Figure 2:
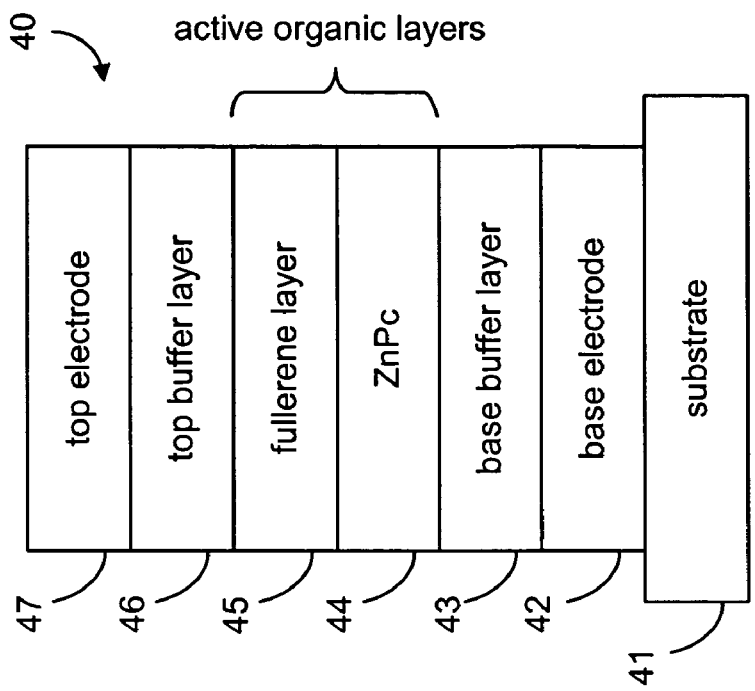
FIG. 2 is a schematic representation showing a prior art photocell.
Figure 1C:
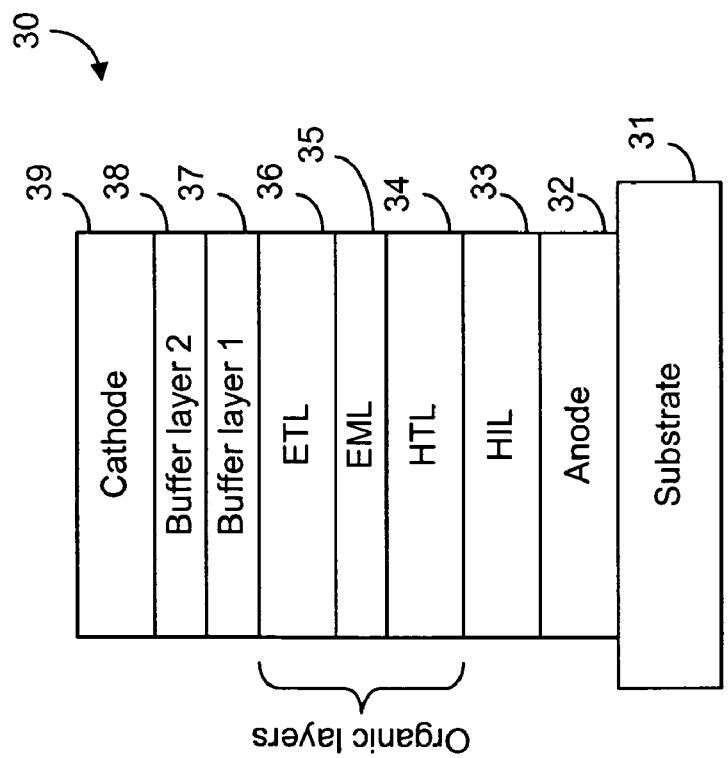
FIG. 1c is a schematic representation showing yet another prior art organic light emitting diode.
Figure 3B:
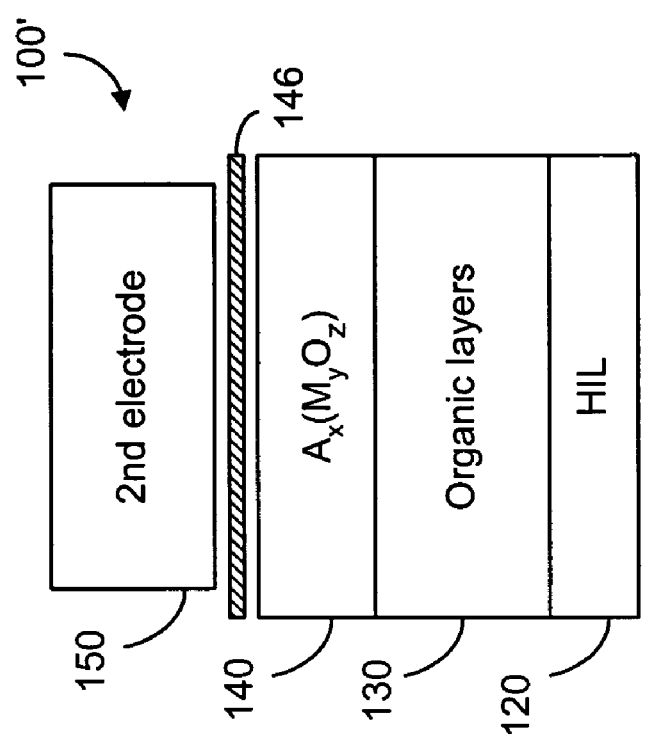
FIG. 3b is a schematic representation showing yet another embodiment of the present invention.
Figure 3A:
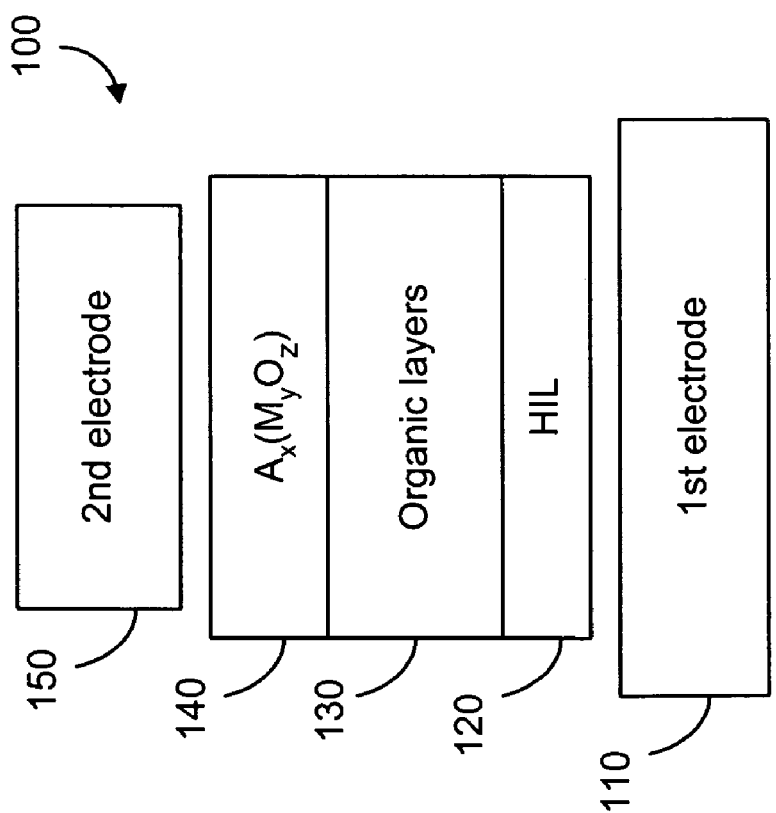
FIG. 3a is a schematic representation showing an embodiment of the organic optoelectronic device, according to the present invention.

FIG. 3a is a schematic representation showing an embodiment of the present invention. As shown in FIG. 3a, an organic optoelectronic device 100 comprises a first electrode 110, a hole injection layer 120, a plurality of organic layers 130, a layer 140 of an oxide-based alkali or alkaline-earth metal intercalation compound and a second electrode 150. In general, the organic layers 130 comprise a hole transport layer, a luminescent layer and an electron transport layer, similar to the organic layers in prior art OLEDs as shown in FIGS. 1a to 1c. The organic layers 130 may comprise a fullerene layer and a phthalocyanine layer, similar to the organic layers in a prior art photocell, as shown in FIG. 2. In particular, the oxide-based alkali or alkaline-earth metal intercalation compound takes the form of a chemical formula $A_x(M_yO_z)$, where x, y, z are positive integers greater than zero. The letter A represents an alkali or alkaline-earth element; M represents a metal, a transitional metal or an alloy thereof; and O represents an oxygen atom. The oxide-based alkali or alkaline-earth metal intercalation compound can be: $LiMn_2O_4$, $LiCoO_2$, $LiNbO_3$, $Li_2WO_4$, $Cs_2WO_4$, $CsMnO_4$, $CsVO_4$, $CsTi_6O_{13}$, $MgTiO_3$, $MgWO_4$, $MgZrO_3$, and $Li(Ni_{0.8}Co_{0.2})O_2$, for example.

In the above compounds:

Li=Lithium
Mn=Manganese
O=Oxygen
Co=Cobalt
Nb=Niobium
W=Tungsten
Cs=Cesium
V=Valadium
Ti=Titanium
Mg=Magnesium
Zr=Zirconium
Ni=Nickel In an organic light-emitting diode, according to the present invention, the first electrode 110 is an anode made of any one of the following metallic oxides or the combination thereof: indium-tin oxide, aluminum-doped zinc oxide, indium-doped zinc-oxide, tin-oxide, magnesium-tin oxide, nickel-tungsten oxide, cadmium-tin oxide and the like. The second electrode 150 is a cathode that can be made of any one of the following metals or the alloys thereof: aluminum, silver, magnesium-silver alloy and the like.

It is possible to provide one or more buffer layers between the oxide-based alkali or alkaline-earth metal intercalation compound layer 140 and the second electrode layer 150. One or more of these buffer layers can be made of a non-conductive layer having a thickness between 0.3 nm and 5 nm. One such buffer layer 146 is shown in FIG. 3b. The buffer layer can also be made of one or more alkali oxides (or halides), alkaline-earth oxides (or halides) having a thickness between 0.3 nm and 5 nm.

In a photocell, according to the present invention, the first electrode 110 is a base electrode (similar to the base electrode 42 of FIG. 2) made of any one of the following metallic oxides or the combination thereof: indium-tin oxide, aluminum-doped zinc oxide, indium-doped zinc-oxide, tin-oxide, magnesium-tin oxide, nickel-tungsten oxide, cadmium-tin oxide and the like. The second electrode 150 is a top electrode (similar to the top electrode 47 of FIG. 2) made of any one of the follow metals or the alloys thereof: aluminum, silver, magnesium-silver alloy and the like.

As with the buffer layer in the organic light emitting diode, according to the present invention, it is possible to provide one or more buffer layers 146 between the oxide-based alkali or alkaline-earth metal intercalation compound layer 140 and the top electrode layer of the photocell.

Figure 4:
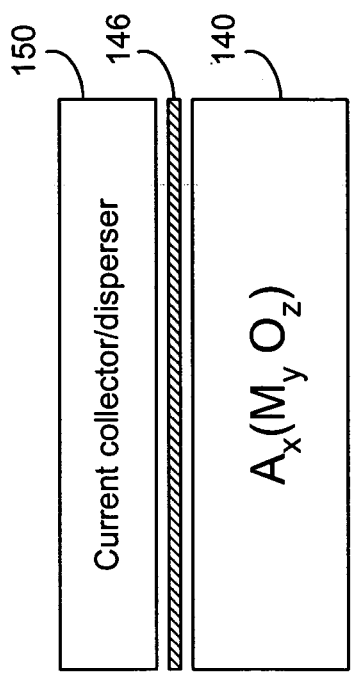
FIG. 4 is a schematic representation showing an electrode structure, according to the present invention.

Thus, the present invention provides an electrode structure for use in an organic optoelectronic device. As shown in FIG. 4, the electrode structure 200, according to the present invention, comprises a current collector or disperser 150 and an oxide-based alkali or alkaline-earth metal intercalation compound layer 140 associated with the current collector or disperser 150. Additionally, a non-conductive layer 146 having a thickness substantially between 0.3 nm and 5 nm is provided between the layers 140 and 150. The layer 146 can be made of one or more alkali oxides (or halides), alkaline-earth oxides (or halides). Preferably, the layer 146 is made substantially of LiF.

Figure 5B:
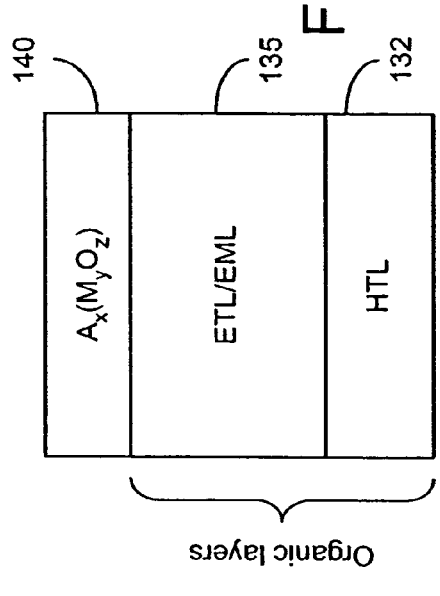
FIG. 5b is a schematic representation showing the organic layers in another embodiment of the present invention.
Figure 5D:
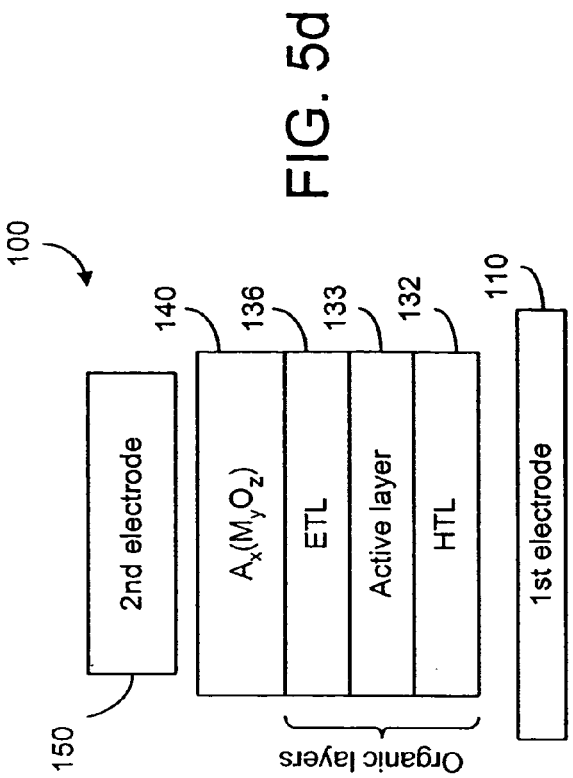
FIG. 5d is a schematic representation showing the organic layers in still another embodiment of the present invention.
Figure 5A:
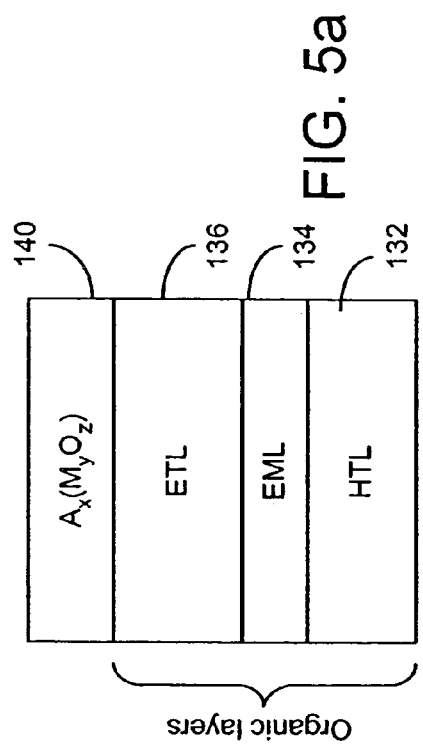
FIG. 5a is a schematic representation showing the organic layers in one embodiment of the present invention.
Figure 5C:
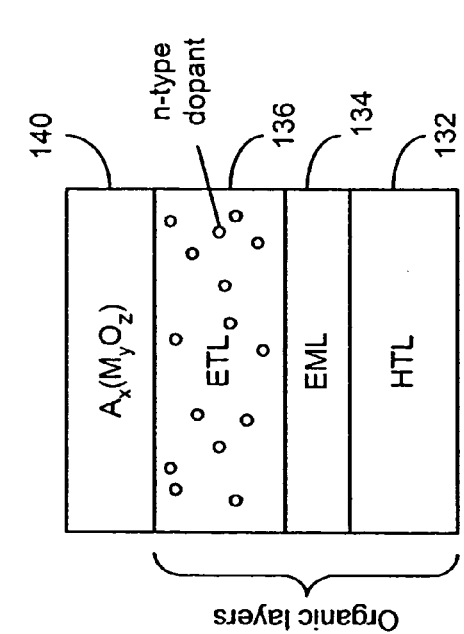
FIG. 5c is a schematic representation showing the organic layers in yet another embodiment of the present invention.
Figure 7A:
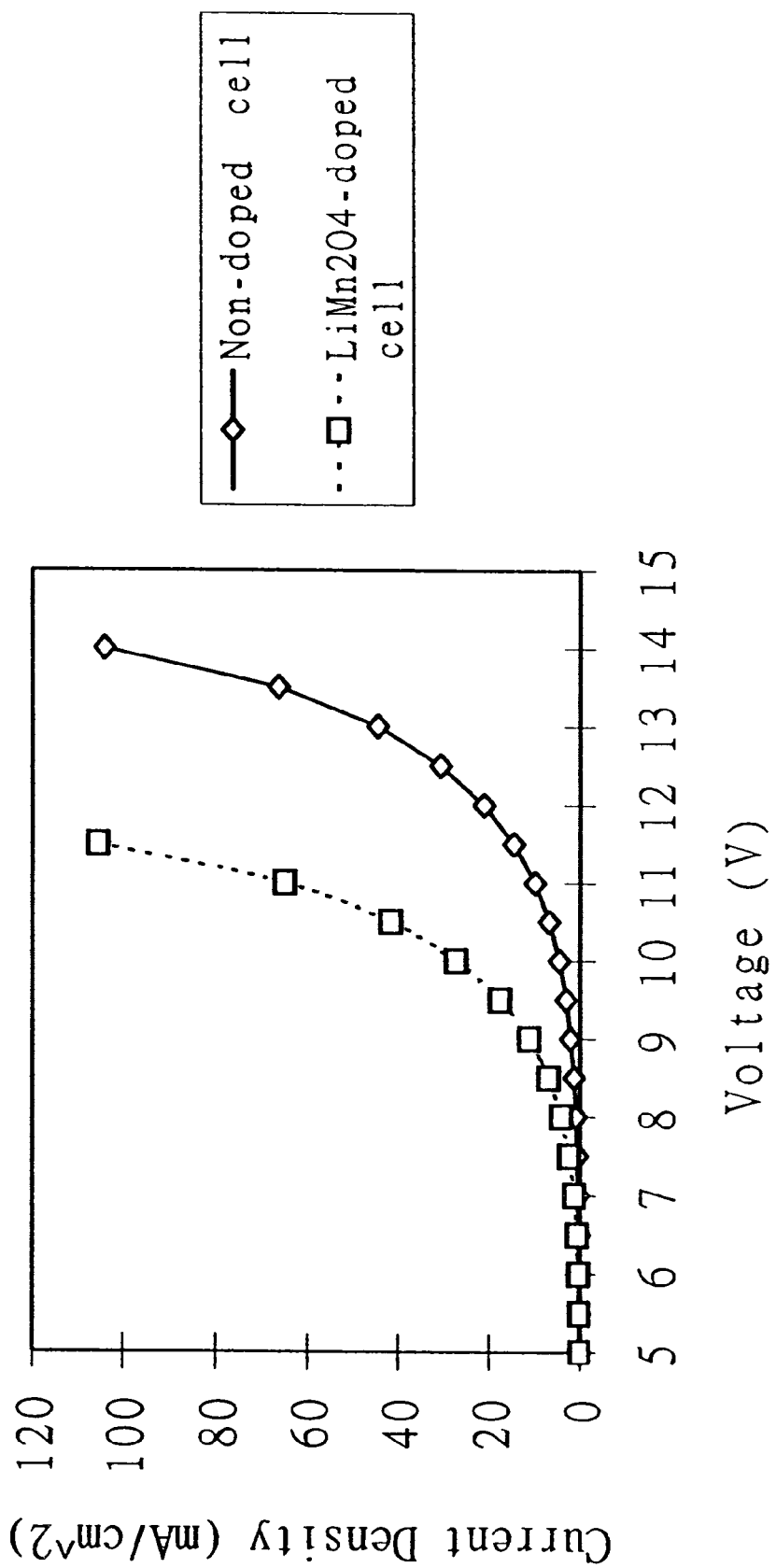
FIG. 7a is a plot of current density vs. voltage to show the improvement of an OLED, according to the present invention, over a prior art counterpart.
Figure 7B:
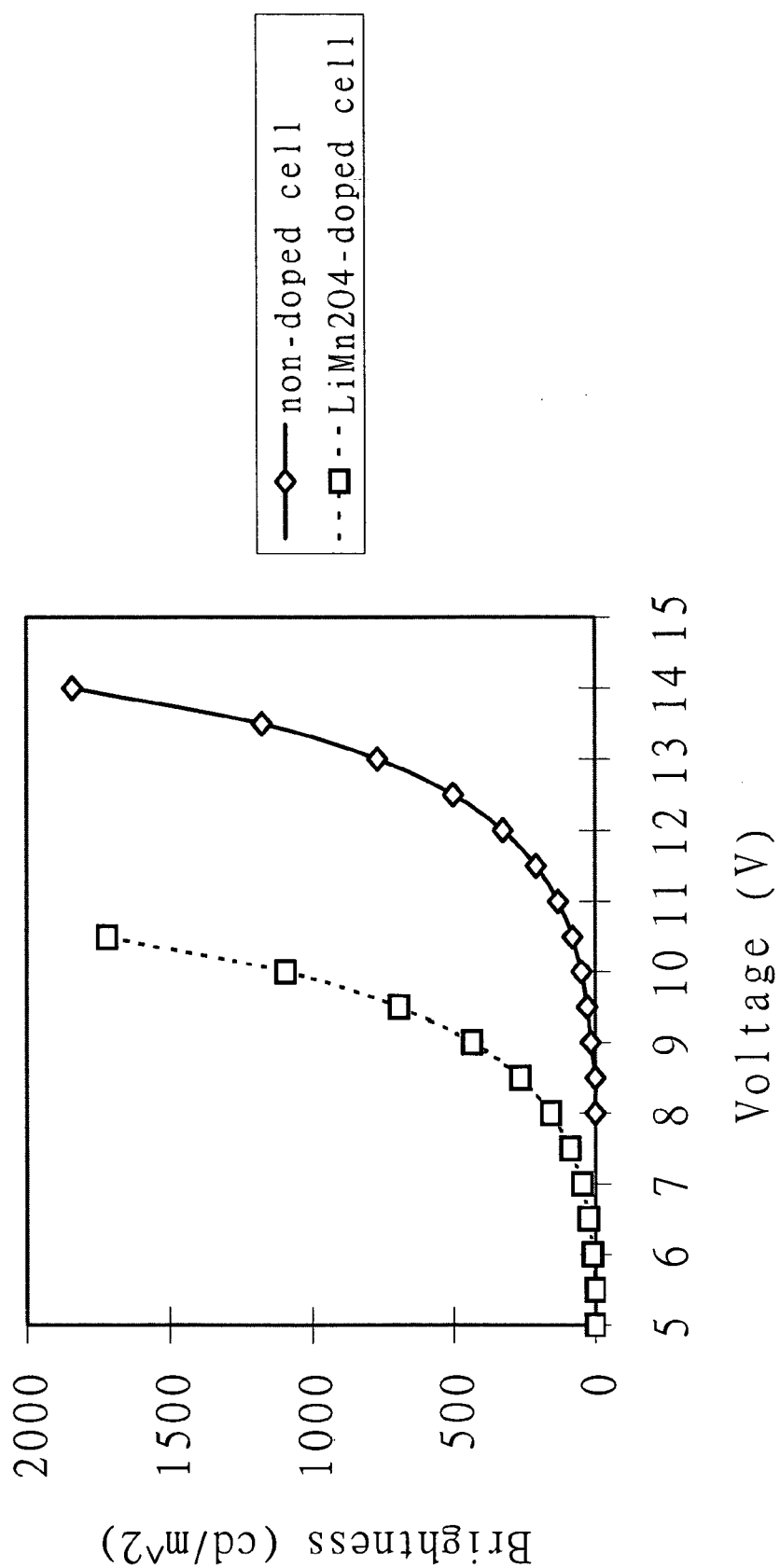
FIG. 7b is a plot of brightness vs. voltage to show the improvement of an OLED, according to the present invention, over a prior art counterpart.
Figure 7C:
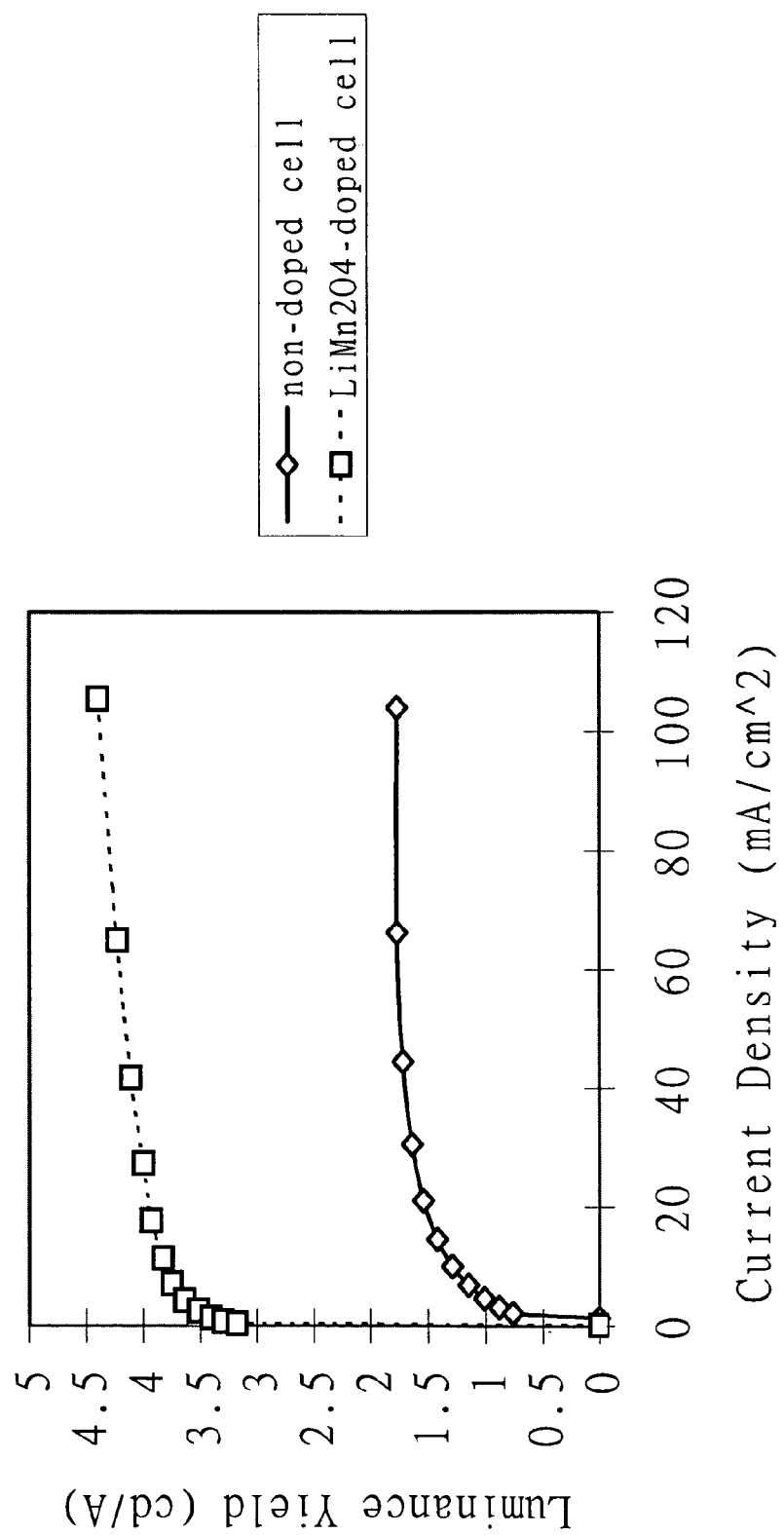
FIG. 7c is a plot of luminance yield vs. current density to show the improvement of an OLED, according to the present invention, over a prior art counterpart.
Figure 7D:
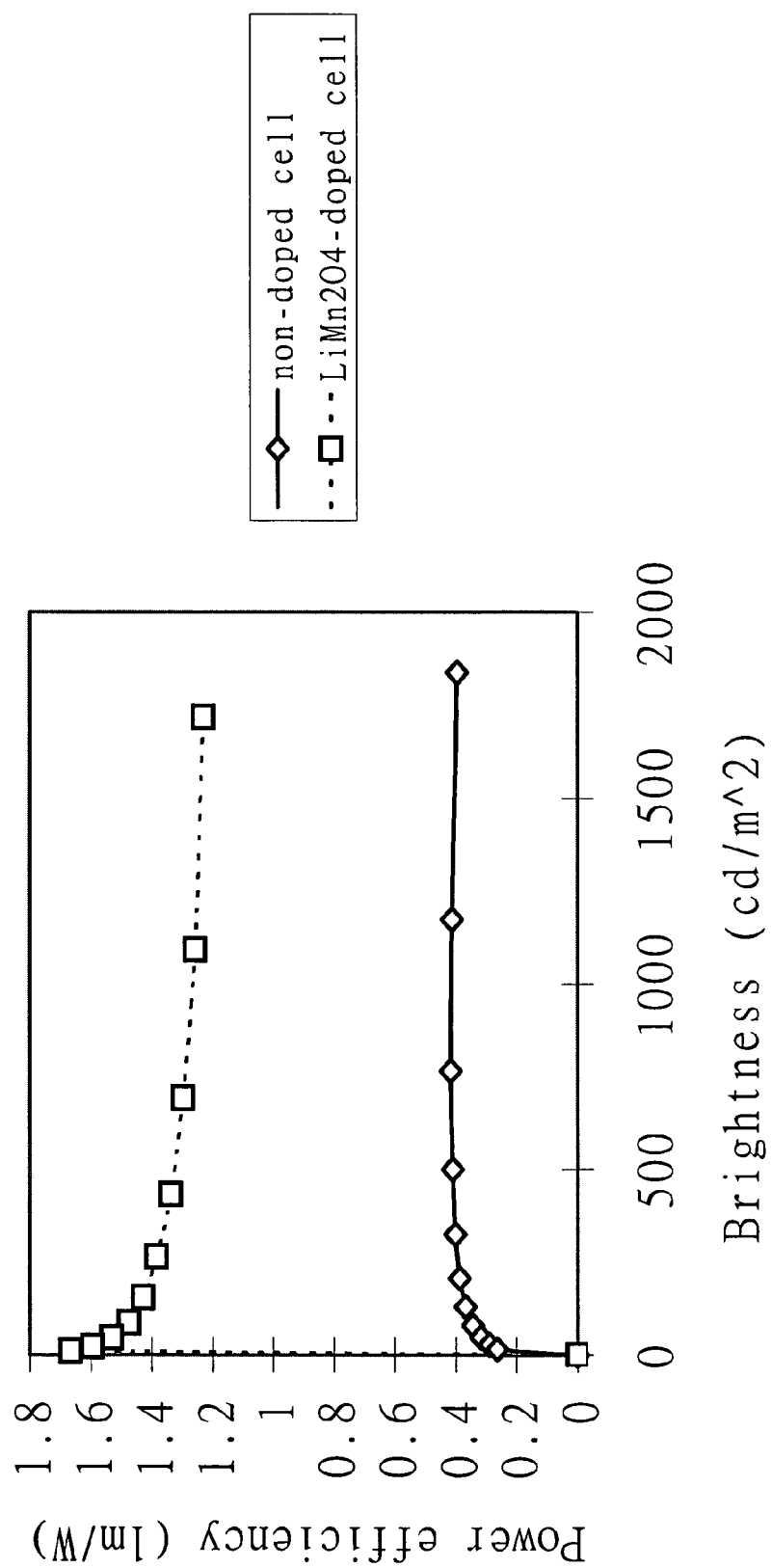
FIG. 7d is a plot of power efficiency vs. brightness to show the improvement of an OLED, according to the present invention, over a prior art counterpart.

The organic layers 130 as shown in FIGS. 3a and 3b can have different structures. In one embodiment of the present invention, the organic layers comprise a hole transport layer 132, an emissive layer 134 and an electron transport layer 136, as shown in FIG. 5a. In another embodiment of the present invention, the organic layers comprise a hole transport layer 132 and a combined ETL/EML layer 135. The combined layer 135 has an electron transport section adjacent to the oxide-based compound layer 140 and an emissive section adjacent to the hole transport layer 132. Furthermore, it is possible to incorporate an n-type dopant that has a strong electron-donating characteristic into the electron transport layer 136 as shown in FIG. 5c. The incorporation of an n-type dopant into the electron transport layer is known in the art. When the optoelectronic device 100 is constructed as a photocell, the organic layers may comprise a hole transport layer 132, an electron transport 132 and an active layer 133, as shown in FIG. 5d. The active layer 133 produces electron-hole pairs in response to electromagnetic radiation of in a certain energy range.

Figure 6:
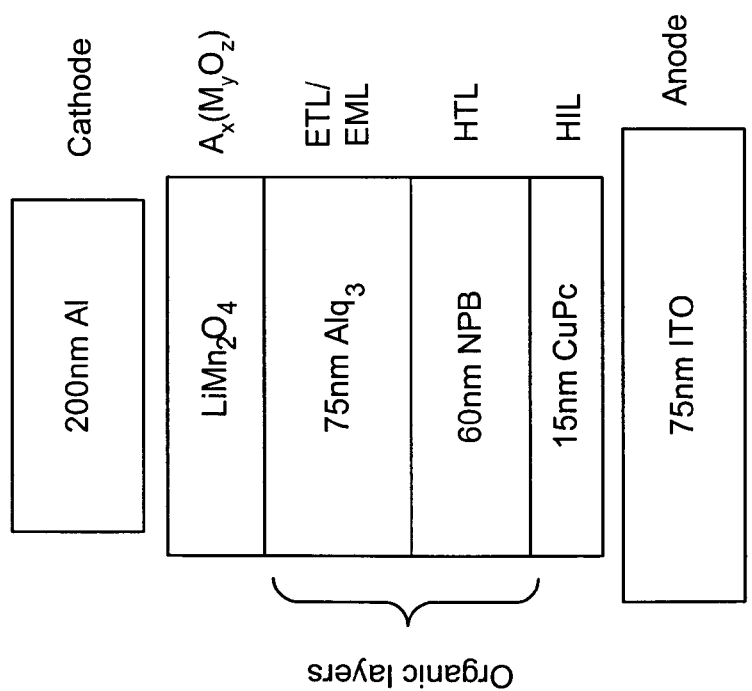
FIG. 6 is a schematic representation showing an organic light emitting diode that is used to show the effect of an oxide-based alkali or alkaline-earth metal intercalation compound.

In order to demonstrate the improvement in the efficiency, an exemplary OLED is fabricated as shown in FIG. 6. In particular, the anode is a 75 nm-thick layer of ITO; the hole injection layer is a 15 nm-thick layer of CuPc; the hole transport layer is a 60 nm-thick layer of NPB; a 75 nm-thick layer of $Alq_3$ is used both as the luminescent layer and the electronic transport layer; the $A_x(M_yO_z)$ layer is made of $LiMn_2O_4$; and the cathode is a 200 nm-thick layer of aluminum. The experimental results are shown in FIGS. 7a to 7d. In each of FIGS. 7a to 7d, Curve B represents the device with the $LiMn_2O_4$ layer, whereas Curve A represents the device without the $LiMn_2O_4$ layer.

In sum, the present invention provides a method to enhance the operational efficiency in an organic optoelectronic device having an active organic sub-structure disposed between a first electrode and a second electrode. The efficiency can be improved by enhancing the election transport process in the organic sub-structure. In particular, the enhancement can be achieved by providing a layer of one or more oxide-based alkali or alkaline-earth metal intercalation compounds as an efficient electron transport layer to the organic sub-structure. The oxide-based alkali or alkaline-earth metal intercalation compound layer is associated with the electrode that is used as a current collector or disperser.

Although the invention has been described with respect to one or more embodiments thereof, it will be understood by those skilled in the art that the foregoing and various other changes, omissions and deviations in the form and detail thereof may be made without departing from the scope of this invention.

What is claimed is:

1. An optoelectronic device comprising:
   a first electrode;
   a second electrode disposed in relationship to the first electrode;
   an organic optoelectronic sub-structure disposed between the first and the second electrodes; and
   an inorganic layer substantially made of at least one oxide-based alkali or alkaline-earth metal intercalation compound in association to the organic optoelectronic sub-structure, wherein the oxide-based alkali or alkaline-earth metal intercalation compound is $LiMn_2O_4$, and wherein the inorganic layer is disposed between the organic optoelectronic sub-structure and the second electrode.

2. The optoelectronic device of claim 1, wherein
   the first electrode comprises an anode;
   the second electrode comprises a cathode; and
   the inorganic layer is disposed between the cathode and the organic optoelectronic sub-structure, and wherein the sub-structure comprises:
      a hole transport layer adjacent to the anode,
      an electron transport section adjacent to the inorganic layer; and
      an emissive section between the hole transport layer and the electronic transport section.

3. The optoelectronic device of claim 2, further comprising:
   a hole injection layer disposed between the anode and the hole transport layer.

4. The optoelectronic device of claim 2, wherein the anode is made from one or more materials selected from the group consisting of indium-tin oxide, aluminum doped zinc oxide, indium doped zinc oxide, tin oxide, magnesium-indium oxide, nickel-tungsten oxide, and cadmium-tin oxide.

5. The optoelectronic device of claim 2, wherein the cathode is made from one or more of the materials selected from the group consisting of aluminum, silver, and magnesium-silver alloy.

6. The optoelectronic device of claim 2, wherein the emissive section is made substantially of $Alq_3$.

7. The optoelectronic device of claim 2, wherein the electron transport section is made substantially of $Alq_3$.

8. The optoelectronic device of claim 2, wherein the hole transport layer is made substantially of NPB.

9. The optoelectronic device of claim 3, wherein the hole injection layer is made substantially of CuPc.

10. The optoelectronic device of claim 1, further comprising an insulation layer disposed between the cathode and the inorganic layer.

11. The optoelectronic device of claim 10, wherein the insulation layer is made substantially of alkali halide or alkali oxide.

12. The optoelectronic device of claim 10, wherein the insulation layer is made substantially of LiF.

13. The optoelectronic device of claim 1, wherein the organic optoelectronic sub-structure comprises an emissive section.

14. The optoelectronic device of claim 1, wherein the organic optoelectronic sub-structure comprises:
a hole transport layer adjacent to the first electrode;
an electron transport layer adjacent to the inorganic layer; and
an active layer disposed between the hole transport layer and the electron transport layer for producing electron-hole pairs in response to electromagnetic radiation.

15. The optoelectronic device of claim 1, wherein the organic optoelectronic sub-structure comprises an active layer for producing electron-hole pairs in response to electromagnetic radiation.

16. An electrode structure for use in an optoelectronic device, the optoelectronic device comprising an organic optoelectronic sub-structure having an electron flow associated thereto, said electrode structure comprising:
an electrically conducting layer for providing an electric current associated with the electron flow; and
an inorganic layer substantially made of $LiMn_2O_4$, wherein the inorganic layer is disposed between the electrically conducting layer and the organic optoelectronic sub-structure.

17. The electrode structure of claim 16, further comprising:
an insulation layer disposed between the inorganic layer and electrically conducting layer.

18. The electronic structure of claim 17, wherein the insulation layer is made substantially of alkali halide or alkali oxide.

* * * * *

UNITED STATES PATENT AND TRADEMARK OFFICE
CERTIFICATE OF CORRECTION

PATENT NO. : 7,259,405 B2 Page 1 of 1
APPLICATION NO. : 10/995878
DATED : August 21, 2007
INVENTOR(S) : Liu It is certified that error appears in the above-identified patent and that said Letters Patent is hereby corrected as shown below:

Column 2, line 8, "Alq3" should be --$Alq_3$--.
Column 2, line 49, before "US", --(-- should be inserted.

Signed and Sealed this

First Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,259,405 B2  Page 1 of 1
APPLICATION NO. : 10/995878
DATED : August 21, 2007
INVENTOR(S) : Tswen-Hsin Liu It is certified that error appears in the above-identified patent and that said Letters Patent is hereby corrected as shown below:

Title Page item 56 please add the following references:

U.S. 5,776,623 – 7/7/98  Hung, et al  428/690
U.S. 6,013,384 – 1/11/2000  Kido, et al  428/690
U.S. 2004/32206 – 2/19/04  Weaver, et al  313/504
U.S. 6,551,725 – 4/22/03  Raychaudhuri, et al  428/690
U.S. 6,580,027 – 6/17/03  Forrest, et al  136/263
U.S. 6,559,375 – 5/6/03  Meissner, et al  136/263
U.S. 6,765,350 – 7/20/04  Burroughes, et al  313/506
U.S. 6,765,349 – 7/20/04  Liao, et al  313/504

Signed and Sealed this

Twenty-first Day of April, 2009

JOHN DOLL
*Acting Director of the United States Patent and Trademark Office*